US008510068B2

(12) United States Patent
Kawashima

(10) Patent No.: US 8,510,068 B2
(45) Date of Patent: Aug. 13, 2013

(54) PHOTOELECTRIC SMOKE SENSOR

(75) Inventor: Takahiro Kawashima, Tokyo (JP)

(73) Assignee: Nohmi Bosai Ltd., Tokyo (JP)

( * ) Notice: Subject to any disclaimer, the term of this patent is extended or adjusted under 35 U.S.C. 154(b) by 453 days.

(21) Appl. No.: 12/957,694

(22) Filed: Dec. 1, 2010

(65) Prior Publication Data

US 2011/0144936 A1 Jun. 16, 2011

(30) Foreign Application Priority Data

Dec. 10, 2009 (JP) ................................ 2009-280784

(51) Int. Cl.
*G01R 35/00* (2006.01)

(52) U.S. Cl.
USPC ................ 702/87; 702/86; 702/104; 702/189

(58) Field of Classification Search
USPC ............. 702/86, 87, 104, 189; 356/337–338, 356/437–438; 340/577, 632, 693.6; 250/200, 250/554
See application file for complete search history.

(56) References Cited

U.S. PATENT DOCUMENTS 5,764,142 A * 6/1998 Anderson et al. ............. 340/511
6,011,478 A 1/2000 Suzuki et al.
6,583,404 B1 * 6/2003 Sakurai ...................... 250/222.2

FOREIGN PATENT DOCUMENTS

EP 0 877 345 11/1998

OTHER PUBLICATIONS

European Search Report (in English language) issued Mar. 25, 2011 in corresponding European Patent Application No. 10 19 3547.

* cited by examiner

*Primary Examiner* — Elias Desta
(74) *Attorney, Agent, or Firm* — Wenderoth, Lind & Ponack, LLP

(57) ABSTRACT

Provided is a photoelectric smoke sensor capable of correcting a sensitivity according to a state of contamination. The photoelectric smoke sensor includes: a storage section (6) for storing a zero detection value VN and an initial zero detection value; a moving average value calculating section (51) for calculating a moving average value of detection AD values output from a detection portion (1, 2, 3); a zero detection value updating section (52) for calculating a new zero detection value VN when a sensitivity of the detection portion is decreased as compared with that in an initial state, and in addition, when a rate of change in the moving average value with respect to the zero detection value VN exceeds a predetermined value; a detection AD value correcting section (53) for correcting the detection value; and a smoke-density computing section (54) for converting the corrected detection value into smoke-density data.

6 Claims, 14 Drawing Sheets

PHOTOELECTRIC SMOKE SENSOR

BACKGROUND OF THE INVENTION

1. Field of the Invention

The present invention relates to a photoelectric smoke sensor for outputting smoke-density data (which is an analog value corresponding to a smoke density), in particular, a photoelectric smoke sensor having a function of correcting a detection value which changes over time due to contamination of detection means.

2. Description of the Related Art

The following photoelectric smoke sensor is conventionally known. The photoelectric smoke sensor includes a light-emitting element and a light-receiving element. Scattered light of light emitted from the light-emitting element is detected by the light-receiving element provided in a labyrinth. In this manner, the photoelectric smoke sensor detects smoke.

In the photoelectric smoke sensor as described above, a value detected by the light-receiving element corresponding to detection means changes over time due to contamination occurring in the labyrinth. A technology for correcting a sensitivity has been proposed so as to more precisely detect a smoke density even when the aforementioned change over time occurs (for example, see Japanese Patent Application Laid-open No. 8-255291 (pages 2 and 3 and FIGS. 5 and 6)).

A correction method for a smoke sensor, which is described in Japanese Patent Application Laid-open No. 8-255291 cited above, includes a first step of obtaining a difference between a previous zero-point value of the smoke sensor and a newly measured zero-point value, a second step of correcting the zero-point value to the newly obtained value when the difference is within a correction limit width, a third step of setting a test warning point value to a value corrected by the difference, and a fourth step of correcting a conversion characteristic between a light-receiving amount and the smoke density to a conversion characteristic obtained by connecting the corrected zero-point value and the corrected test warning point value.

According to the method of correcting a sensitivity of the smoke sensor, the conversion characteristic (conversion formula) between the light-receiving amount of the smoke sensor and the smoke density is corrected to a conversion formula obtained by translating the conversion formula in an initial state. Then, according to the corrected conversion formula, the light-receiving amount received by the light-receiving element is converted into an analog value corresponding to the smoke density.

Factors of the change generated in the detection value of the light-receiving element over time include the contamination of an inner wall of the labyrinth in which the light-receiving element is provided and the contamination of the light-emitting element or the light-receiving element.

When the contamination occurs in the labyrinth, the amount of reflection (noise level) of the light emitted from the light-emitting element is increased by a predetermined amount. Specifically, in the environment with the same smoke density, the amount of light received by the light-receiving element is increased by a predetermined amount after the contamination occurs in the labyrinth as compared with that before the contamination occurs. Therefore, for a characteristic function of the light-receiving amount corresponding to smoke-density data, a detection level for the light-receiving amount is shifted upward after the contamination occurs as compared with that before the occurrence of the contamination.

Therefore, after the contamination occurs, the conversion formula is corrected to be translated so that the detection level for the light-emitting amount becomes higher. In this manner, the conversion formula suitable for a state of the contamination can be obtained.

On the other hand, when the contamination of the light-emitting element or the light-receiving element occurs, the detection value of the light-receiving element is reduced at a predetermined rate. Therefore, a slope of a straight line of the characteristic function of the light-receiving amount corresponding to the smoke-density data becomes lower as compared with that before the contamination occurs.

Specifically, as in the related art, with the conversion formula obtained by translating the conversion formula obtained before the occurrence of the contamination, a correction suitable for the state of the contamination of the light-emitting element or the light-receiving element cannot be performed.

SUMMARY OF THE INVENTION

The present invention has been made to solve the problem described above, and therefore has an object to provide a photoelectric smoke sensor capable of correcting a sensitivity in a manner suitable for a state of contamination.

According to the present invention, there is provided a photoelectric smoke sensor including: detection means including a light-emitting element and a light-receiving element housed within a smoke detection space, for outputting a detection value of the light-receiving element for receiving light scattered by smoke, the light being emitted from the light-emitting element; a smoke-density computing section for converting the detection value output from the detection means into smoke-density data based on a conversion formula; a zero detection value storing section for storing a zero detection value corresponding to the detection value of the light-receiving element when a smoke density is zero; an initial zero detection value storing section for storing an initial zero detection value corresponding to an initial value of the zero detection value; a moving average value calculating section for calculating a moving average value of the detection values output from the detection means; a zero detection value updating section for dividing the initial zero detection value by a predetermined correction factor to calculate a new zero detection value when a sensitivity of the detection means is decreased as compared with that in an initial state, and in addition, when a rate of change in the moving average value with respect to the zero detection value exceeds a predetermined value; and a detection value correcting section for multiplying a difference between the detection value and the zero detection value updated by the zero detection value updating section by the predetermined correction factor to correct the detection value, in which the smoke-density computing section converts the detection value corrected by the detection value correcting section into the smoke-density data based on the conversion formula.

In the photoelectric smoke sensor according to the present invention, the correction factor is calculated by raising a basic correction factor corresponding to a given value to the N-th power, where N is a value obtained by adding one to the new zero detection value previously calculated by the zero detection value updating section.

In the photoelectric smoke sensor according to the present invention, the basic correction factor is set so that, when a detection value is repeatedly corrected by using the correction factor calculated by incrementing the value of N by one at a time, an amount of change in the smoke-density data corresponding to the each corrected detection value becomes substantially the same.

In the photoelectric smoke sensor according to the present invention, when the sensitivity of the detection means is increased as compared with that in the initial state and, in addition, when a difference between the zero detection value and the moving average value exceeds a predetermined value, the zero detection value updating section adds a predetermined correction value to the initial zero detection value to calculate the new zero detection value, and the detection value correcting section corrects the detection value by subtracting the zero detection value updated by the zero detection value updating section from the detection value.

According to the photoelectric smoke sensor of the present invention, when the sensitivity of the detection means is decreased as compared with that in the initial state and, in addition, when the rate of change in the moving average value of the detection values with respect to the zero detection value exceeds the predetermined value, the initial zero detection value is divided by the predetermined correction factor to calculate the new zero detection value. In addition, the difference between the detection value and the updated zero detection value is multiplied by the predetermined correction factor to correct the detection value. Therefore, the correction suitable for the characteristic function (characteristic function of the detection value and the smoke-density data) in a straight line with a lower slope as compared with that in the initial state can be performed. Specifically, the detection value can be corrected so as to be suitable for the state of contamination.

According to the photoelectric smoke sensor of the present invention, the correction factor is calculated by raising the basic correction factor corresponding to the given value to the N-th power. N is the value obtained by adding one to the previously calculated new zero detection value. Thus, the detection value can be corrected in a stepwise manner. For example, even if the noise is superposed, it is not necessary to perform a large amount of correction at one time.

According to the photoelectric smoke sensor of the present invention, when the predetermined detection value is repeatedly corrected by using the correction factor calculated by incrementing the value of N by one at a time, the basic correction factor is set so that the amount of change in the smoke-density data corresponding to the each corrected predetermined detection value becomes substantially the same. Therefore, the number of steps of the correction of the detection value and the amount of change in the smoke-density data for each step are multiplied. As a result, the correction amount for the smoke-density data, which is changed with the correction of the detection value, can be easily calculated.

DETAILED DESCRIPTION OF THE PREFERRED EMBODIMENT

Embodiment (Overall Configuration)

Figure 1:
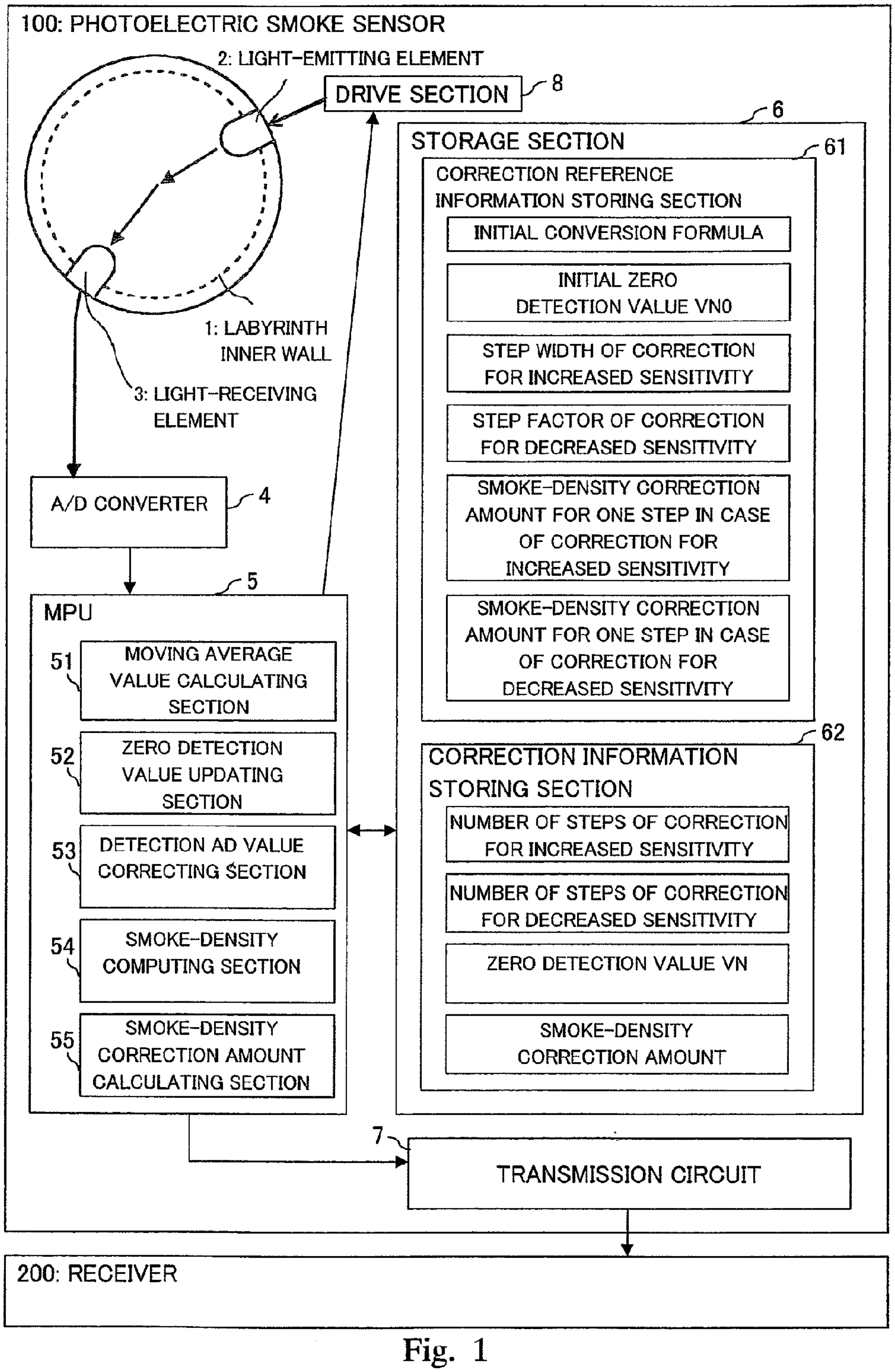
FIG. 1 is a functional block diagram of a photoelectric smoke sensor according to an embodiment of the present invention.

FIG. 1 is a functional block diagram schematically illustrating a photoelectric smoke sensor 100 according to an embodiment of the present invention.

The photoelectric smoke sensor 100 includes a labyrinth inner wall 1, a light-emitting element 2, a light-receiving element 3, an A/D converter 4, an MPU 5, a storage section 6, and a transmission circuit 7. Inside the labyrinth inner wall 1, a smoke detection space is formed.

The light-emitting element 2 is controlled by a drive section 8 to generate light with a predetermined pulse width inside the labyrinth inner wall 1 (in the smoke detection space).

The light-receiving element 3 is provided at a position so that an optical axis thereof is at a predetermined angle with respect to an optical axis of the light-emitting element 2. The light-receiving element 3 receives scattered light generated by smoke particles present in the smoke detection space and outputs a detection signal based on the amount of received light.

In this embodiment, detection means of the present invention corresponds to the labyrinth inner wall 1, the light-emitting element 2, and the light-receiving element 3.

The A/D converter 4 is a circuit for converting an analog signal obtained by amplifying and frequency-separating the detection signal output from the light-receiving element 3 into a signal at a detection level.

The MPU 5 controls an overall operation of the photoelectric smoke sensor 100 and also performs conversion processing for converting the A/D-converted detection value of the light-receiving element 3 (hereinafter, referred to as "detection AD value") into an analog value corresponding to a smoke density inside the labyrinth inner wall 1. The MPU 5 includes a moving average value calculating section 51, a zero detection value updating section 52, a detection AD value correcting section 53, a smoke-density computing section 54, and a smoke-density correction amount calculating section 55.

The moving average value calculating section 51 calculates a moving average value of the detection values of the light-receiving element 3 output from the A/D converter 4.

The zero detection value updating section 52 corrects a zero detection value corresponding to the detection value of the light-receiving element 3, which is obtained when the smoke density is zero, according to the degree of contamination of the labyrinth inner wall 1, the light-emitting element 2, and the light-receiving element 3.

The detection AD value correcting section 53 corrects the detection AD value according to the degree of contamination of the labyrinth inner wall 1, the light-emitting element 2, and the light-receiving element 3.

The smoke-density computing section 54 converts the corrected detection AD value into an analog value corresponding to the smoke density (hereinafter, sometimes also referred to as "smoke-density data") according to an initial conversion formula (described below) stored in the storage section 6.

The smoke-density correction amount calculating section 55 converts a predetermined correction amount for the detection AD value into a correction amount for the smoke-density data.

The storage section 6 stores a program for controlling an operation of the MPU 5 and various types of data. The storage section 6 includes a correction reference information storing section 61 and a correction information storing section 62.

The initial conversion formula, an initial zero detection value VN0, a step width of correction for increased sensitivity, a step factor of correction for decreased sensitivity, a smoke-density correction amount for one step in the case of the correction for increased sensitivity, and a smoke-density correction amount for one step in the case of the correction for decreased sensitivity are stored in advance in the correction reference information storing section 61.

The correction information storing section 62 is a rewritable area. The number of steps of correction for increased sensitivity, the number of steps of correction for decreased sensitivity, a zero detection value VN, and the smoke-density correction amount are stored in the correction information storing section 62.

Each of the pieces of information stored in the correction reference information storing section 61 and the correction information storing section 62 is described below.

The transmission circuit 7 is a circuit for transmitting and receiving a signal to/from a receiver 200 illustrated in FIG. 1. The transmission circuit 7 transmits the smoke-density data calculated by the MPU 5 to the receiver 200 in response to an output instruction from the receiver 200.

The receiver 200 illustrated in FIG. 1 is connected to the photoelectric smoke sensor 100 through a transmission line (not shown). In this manner, the receiver 200 acquires the smoke-density data from the photoelectric smoke sensor 100 to determine based on the thus acquired smoke-density data whether or not a fire has occurred. In the case where the occurrence of the fire is detected, the receiver 200 controls an audible alarm device (not shown) to issue an alarm, which is similarly connected to the receiver 200 through a transmission line (not shown) and controls a fire door to be closed so as to prevent a flame propagation.

(Operation of the Photoelectric Smoke Sensor 100)

Figure 2:
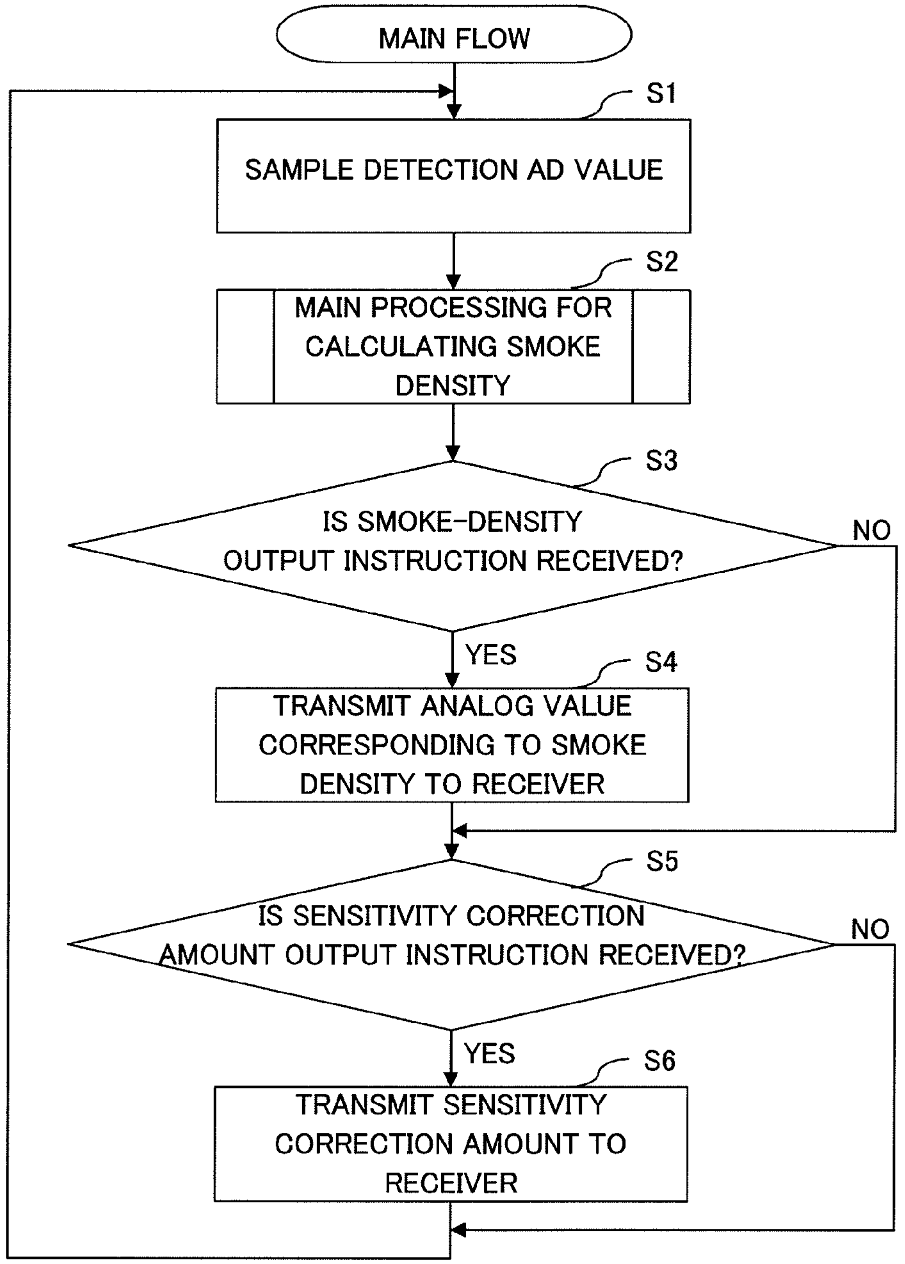
FIG. 2 is a main flowchart illustrating an operation of the photoelectric smoke sensor according to the embodiment of the present invention.

FIG. 2 is a main flowchart illustrating an operation of the photoelectric smoke sensor 100 according to the embodiment.

First, the detection AD value detected by the light-receiving element 3 is subjected to sampling processing (S1).

Next, main processing for calculating the smoke density is performed (S2). In this processing, the detection AD value is corrected according to a state of contamination of each of the labyrinth inner wall 1, the light-emitting element 2, and the light-receiving element 3 so as to be converted into the analog value indicating the smoke density. The details of the main processing for calculating the smoke density are described below.

Then, when the smoke-density output instruction from the receiver 200 is received (S3), the photoelectric smoke sensor 100 transmits the smoke-density data to the receiver 200 (S2). On the other hand, when the smoke-density output instruction is not received, the operation proceeds to Step S5.

Next, when a sensitivity correction amount output instruction corresponding to an instruction to output a correction amount for the smoke-density data (hereinafter, also referred to as "sensitivity correction amount"), which is calculated by the smoke-density correction amount calculating section 55, is received from the receiver 200 (S5), the photoelectric smoke sensor 100 transmits the sensitivity correction amount to the receiver 200 (S6). On the other hand, when the sensitivity correction amount output instruction is not received, the operation returns to Step S1.

The photosensitive smoke sensor 100 repeatedly performs a processing series as described above.

(Change in Sensitivity Characteristics)

Here, the relation among the contamination of the labyrinth inner wall 1, the contamination of the light-emitting element 2 or the light-receiving element 3, and the detection AD value is described.

Figure 3A:
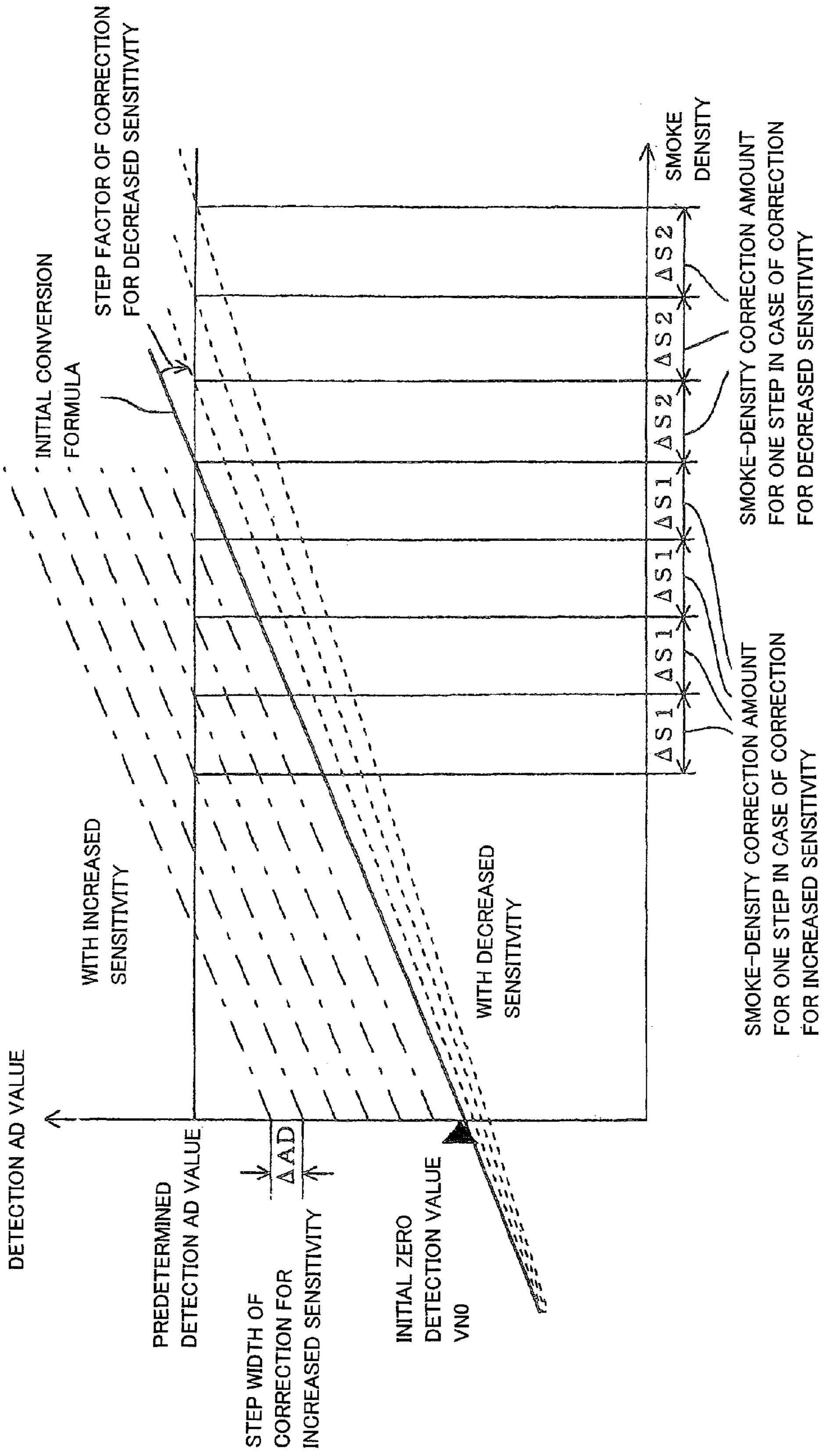
FIGS. 3(A) and 3(B) are explanatory diagrams, each approximating a tendency of a change in a detection AD value with respect to a smoke density in the form of a linear function.

FIG. 3(A) is an explanatory diagram obtained by approximating a conversion formula for converting the detection AD value into the smoke-density data in the form of a linear function. In FIG. 3(A), a conversion formula in an initial state where the contamination has not occurred (hereinafter, referred to as "initial conversion formula") is indicated by a solid line. Each of characteristic functions showing the relation between the detection AD value and the smoke-density data in a state where the contamination of the labyrinth inner wall 1 occurs is indicated by an alternate long and short dash line, whereas each of characteristic functions showing the relation between the detection AD value and the smoke-density data in a state where the contamination of the light-emitting element 2 or the light-receiving element 3 occurs is indicated by a broken line.

(1) Contamination of the Labyrinth Inner Wall 1

With an increase in the degree of contamination of the labyrinth inner wall 1, the amount of reflection (noise level) of the light emitted from the light-emitting element 2 is increased by a given amount. Therefore, the detection AD value increases as a whole. Therefore, as indicated by the alternate long and short dash lines illustrated in FIG. 3(A), the characteristic function indicating the relation between the detection AD value and the smoke-density data is shifted (translated) upward from the initial conversion formula. Moreover, the detection AD value (zero detection value VN) at the time when the smoke density is zero is shifted upward by a given amount according to the degree of contamination.

(2) Contamination of the Light-Emitting Element 2 or the Light-Receiving Element 3

When the light-emitting element 2 or the light-receiving element 3 is contaminated, the amount of transmission of the light is reduced at a given rate with an increase in the degree of contamination. Therefore, as indicated by the broken lines shown in FIG. 3(A), a slope of a straight line of the characteristic function indicating the relation between the detection AD value and the smoke-density data becomes lower than that of the initial conversion formula. Moreover, the zero detection value VN becomes smaller than the initial zero detection value VN0 according to the degree of contamination.

As described above, if the labyrinth inner wall 1 or at least any one of the light-emitting element 2 and the light-receiving element 3 is contaminated, a change occurs in each of the detection AD value and the characteristic function used for converting the detection AD value into the smoke-density data. Thus, for obtaining the smoke-density data with higher accuracy, it is necessary to first correct the detection AD value and then convert the thus corrected detection AD value into the smoke-density data. Accordingly, in this embodiment, when the sensitivity becomes higher due to the occurrence of the contamination of the labyrinth inner wall 1, the characteristic function is translated upward as indicated by the alternate long and short dash lines shown in FIG. 3(A). Thus, the detection AD value is corrected by a value corresponding to the amount of translation. When the sensitivity is decreased due to the contamination of the light-emitting element 2 or the light-receiving element 3, the slope of the characteristic function changes as indicated by the broken lines shown in FIG. 3(A). Therefore, the detection AD value is corrected by the amount corresponding to a change in slope.

(Concept of Correction of the Detection AD Value)

Figure 3B:
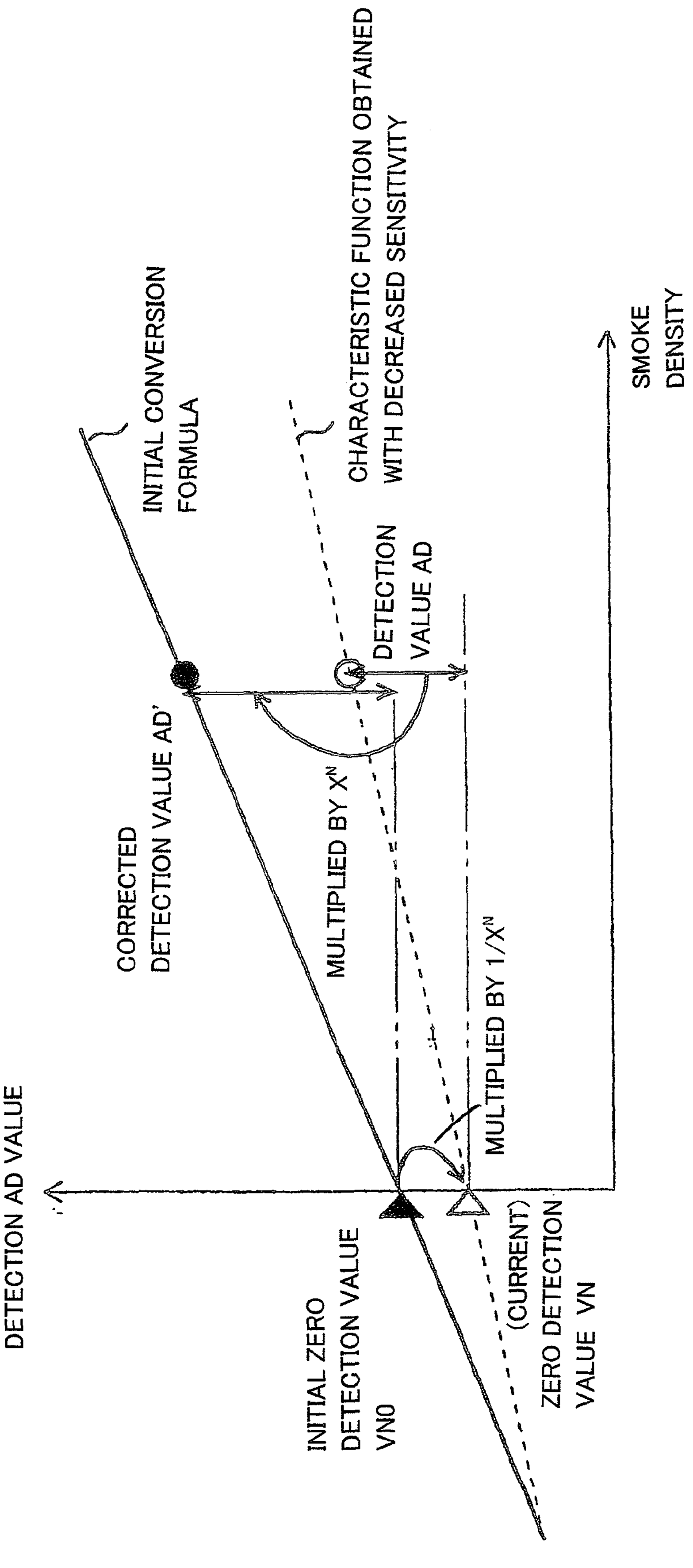

Referring to FIG. 3, the concept of correction of the detection AD value in the case where the sensitivity is decreased, according to this embodiment, is described. FIG. 3(B) is an explanatory diagram illustrating the concept of the correction of the detection AD value in the case where the sensitivity is decreased.

For example, it is assumed that the sensitivity of the light-receiving element 3 is decreased to result in a sensitivity characteristic indicated by the broken line shown in FIG. 3(B). When the zero detection value VN at this time is expressed as $1/X^N$ (where X>1) times as large as the initial zero detection value VN0, a value on a line expressed by the initial conversion formula can be obtained by multiplying the detection AD value detected at a given time by $X^N$. In this embodiment, the detection AD value is corrected to the value on the line expressed by the initial conversion formula based on the concept described above. The details of the correction of the detection AD value are described below referring to FIG. 13.

(Information Stored in the Storage Section)

Next, the information stored in the correction reference information storing section 61 and the correction information storing section 62 illustrated in FIG. 1 is described referring to FIGS. 3(A) and 3(B).

The initial conversion formula is a conversion formula used for converting the detection AD value into the smoke-density data, and is indicated by the solid line in FIG. 3(A).

The initial zero detection value VN0 is an initial value of the zero detection value, which is the detection AD value corresponding to the analog value when the smoke density is zero. The initial zero detection value VN0 is on the line of the initial conversion formula.

A step width of correction for increased sensitivity is a correction amount for one step in the case where the correction of the detection AD value for the increased sensitivity is performed in a stepwise manner. The step width of correction for increased sensitivity corresponds to a difference ΔAD between the conversion formulae indicated by the alternate long and short dash lines illustrated in FIG. 3(A) in a Y-axis direction.

A step factor of correction for decreased sensitivity is a correction factor for one step in the case where the correction of the detection AD value for the decreased sensitivity is performed in a stepwise manner. Each of the conversion formulae indicated by the broken lines in FIG. 3(A) is obtained by dividing the initial conversion formula by a value, which is obtained by raising the step factor of correction for decreased sensitivity to the power of a predetermined number. The step factor of correction for decreased sensitivity is indicated by X in FIG. 3(B).

A smoke-density correction amount ΔS1 for one step in the case of the correction for increased sensitivity is obtained by converting the correction amount for the detection AD value for one step for the increased sensitivity into the correction amount for (amount of change in) the smoke-density data. The step width of correction for increased sensitivity has a fixed value. Accordingly, the smoke-density correction amount ΔS1 for one step in the case of the correction for increased sensitivity also has a fixed value. Therefore, as illustrated in FIG. 3(A), the smoke-density correction amount ΔS1 for one step in the case of the correction for increased sensitivity, which corresponds to the correction amount for the correction of a predetermined AD value (reference detection AD value) for one step, also has a fixed value.

A smoke-density correction amount ΔS2 for one step in the case of the correction for decreased sensitivity is obtained by converting the correction amount for the detection AD value for one step when the sensitivity is decreased into the correction amount for (amount of change in) the smoke-density data. Each of the characteristic functions obtained with the decreased sensitivity has a different slope. Therefore, the amount of change in the smoke-density data, which corresponds to the correction amount for the detection AD value for one step, also differs depending on the characteristic functions. A value obtained by approximating the amounts of change is used as the smoke-density correction amount for one step in the case of the correction for decreased sensitivity. In other words, a step factor of correction for decreased sensitivity is set so that the amount of change in the smoke density for one step in the case of the correction for decreased sensitivity, which corresponds to the correction amount used when the predetermined detection AD value illustrated in FIG. 3(A) is corrected for one step, has substantially the same value. Furthermore, in this embodiment, a step correction factor for correction for decreased sensitivity is set according to the value of the step width of correction for increased sensitivity so that the smoke-density correction amount ΔS1 for one step in the case of the correction for increased sensitivity and the smoke-density correction amount ΔS2 for one step in the case of the correction for decreased sensitivity have substantially the same value.

The number of steps of correction for increased sensitivity is a current number of steps (step number) of the correction performed in a stepwise manner when the sensitivity is increased.

The number of steps of correction for decreased sensitivity is a current number of steps of the correction performed in a stepwise manner when the sensitivity is decreased. In FIG. 3(B), the number of steps of correction for decreased sensitivity is indicated by N.

The zero detection value VN is a current zero detection value and is indicated by a point of intersection between each of the conversion formulae and the Y axis in FIG. 3(A).

The smoke-density correction amount is obtained by converting the correction amount for the predetermined detection AD value on the increased sensitivity side or on the decreased sensitivity side into the correction amount for the analog value corresponding to the smoke density.

In aforementioned Step S6 illustrated in FIG. 2, the sensitivity correction amount transmitted to the receiver 200 is the smoke-density correction amount corresponding to the current number of steps of correction (in each of the case where the correction is performed for the increased sensitivity and the case where the correction is performed for the decreased sensitivity). The amount of change in the smoke-density correction amount for one step is the same for both the correction for increased sensitivity and the correction for decreased sensitivity. Therefore, a user can be informed of a precise degree of correction for the sensitivity (degree of contamination of the photoelectric smoke sensor 100).

The sensitivity correction amount transmitted to the receiver 200 is in a form that allows the receiver 200 to distinguish the sensitivity correction amount in the case of correction for increased sensitivity and the sensitivity correction amount in the case of correction for decreased sensitivity from each other. Therefore, the user can be precisely informed of whether the degree of correction of the sensitivity (degree of contamination of the photoelectric smoke sensor 100) is on the increased sensitivity side or on the decreased sensitivity side.

Next, processing for calculating the smoke density including processing for correcting the detection AD value is described.

(Main Processing for Calculating the Smoke Density)

Figure 4:
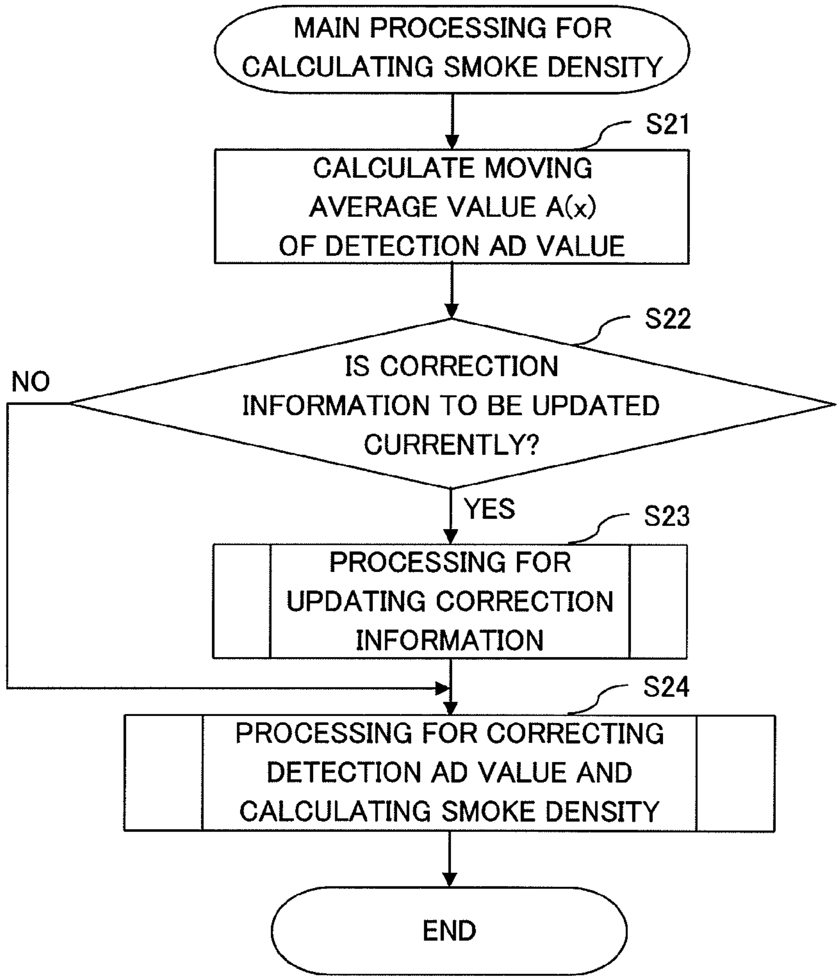
FIG. 4 is a flowchart illustrating main processing for calculating the smoke density, which is illustrated in FIG. 2.

FIG. 4 is a flowchart illustrating the processing for calculating the smoke density described as Step 2 illustrated in FIG. 2. In the processing for calculating the smoke density, the detection AD value of the light-receiving element 3, which is obtained by the conversion performed in the A/D converter 4, is corrected according to the state of contamination of the labyrinth inner wall 1 and that of at least any one of the light-emitting element 2 and the light-receiving element 3 to calculate the analog value corresponding to the smoke density.

(S21)

First, a moving average value A(x) of the detection values is calculated. Specifically, the sum of the detection AD values obtained by previous sampling for N-times is divided by the number N of times of sampling. Then, the sum of the values obtained by repeating the same processing for M-times is divided by M to calculate the moving average value A(x). A method of calculating the moving average is not particularly limited. By repeating the calculation processing as described above, a moving average over, for example, twenty-four hours can be calculated.

(S22)

Subsequently, it is determined whether or not the correction information is to be updated currently. As described below, the photoelectric smoke sensor 100 according to this embodiment corrects the detection AD value. However, the correction information such as the correction amount for performing the correction is not updated each time the correction is performed but is updated at preset predetermined timing. Specifically, within a predetermined period of time, the detection AD value is corrected based on the same correction information. This is because the contamination of the labyrinth inner wall 1, the light-receiving element 3, and the light-emitting element 2 generally develops gradually and therefore, it is scarcely necessary to change the correction information each time. In this manner, a processing burden on the MPU 5 can be reduced.

(S23)

When the correction information is to be updated currently, processing for updating the correction information is performed.

(S24)

Subsequently, based on the previously updated correction information, the processing for correcting the detection AD value and the processing for converting the detection AD value into the analog value corresponding to the smoke density are performed.

Next, the processing for updating the correction information, which is described as Step S23 illustrated in FIG. 4, and the processing for correcting the detection AD value and the processing for calculating the smoke density, which is described as Step S24, are described in this order.

Figure 5:
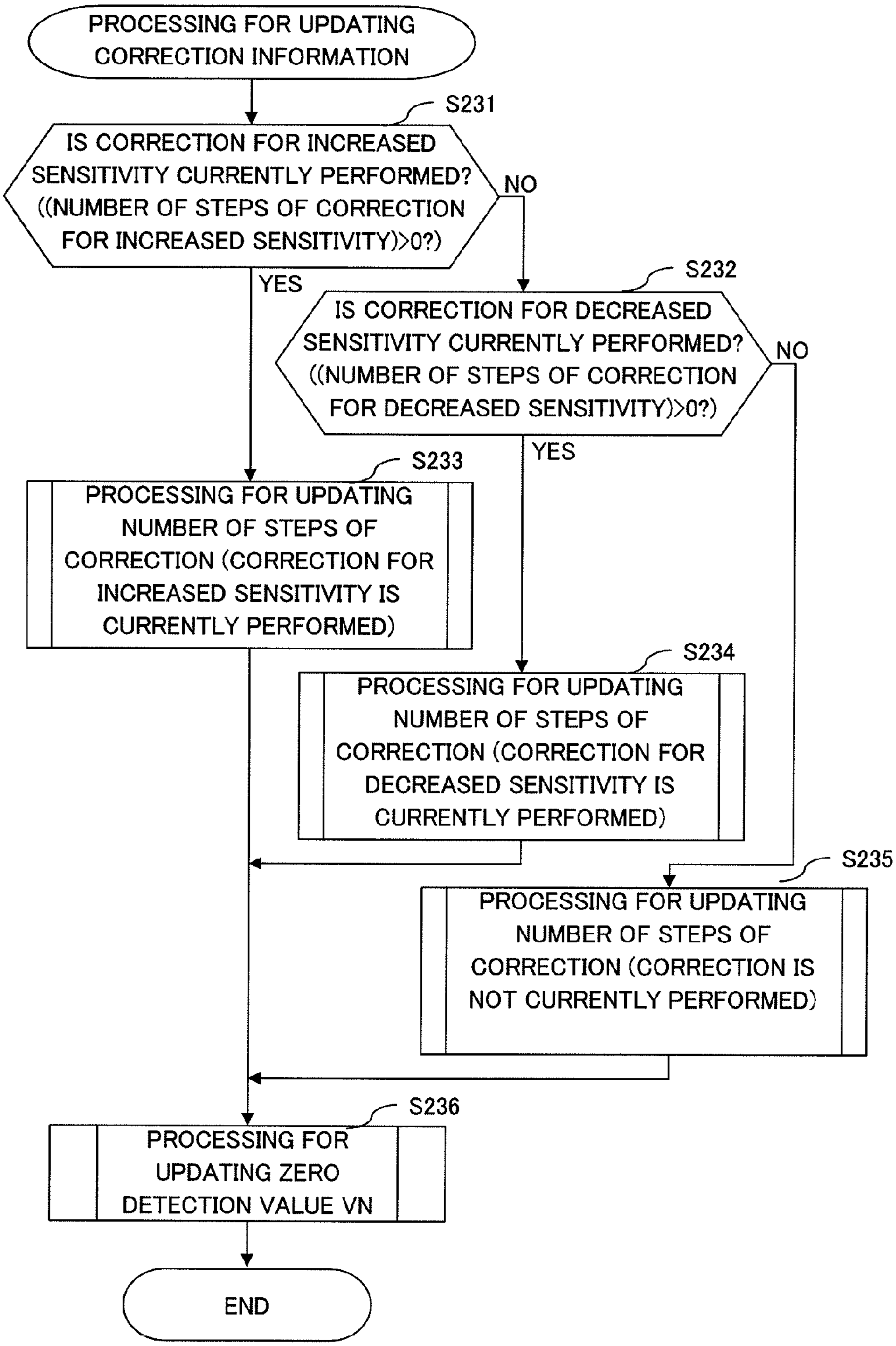
FIG. 5 is a flowchart illustrating processing for updating correction information, which is illustrated in FIG. 4.

FIG. 5 is a flowchart illustrating the processing for updating the correction information, which is described as Step S23 illustrated in FIG. 4.

(S231)

First, it is determined whether or not the correction for increased sensitivity is currently performed. More specifically, it is determined whether or not the value of the number of steps of correction for increased sensitivity, which is stored in the storage section 6, is larger than 0. When the value of the step number is larger than 0, specifically, when the correction for increased sensitivity is currently performed, the processing proceeds to Step S233. If the correction for increased sensitivity is not currently performed, the processing proceeds to Step S232.

(S232)

It is determined whether or not the correction for decreased sensitivity is currently performed. More specifically, it is determined whether or not the value of the number of steps of correction for decreased sensitivity, which is stored in the storage section 6, is larger than 0. When the value of the step number is larger than 0, specifically, when the correction for decreased sensitivity is currently performed, the processing proceeds to Step S234. If the correction for decreased sensitivity is not currently performed, the processing proceeds to Step S235.

(S233, S234, and S235)

The processing for updating the number of steps of correction according to the moving average value A(x) of the detection AD values is performed. The processing for updating the number of steps of correction differs depending on a state, that is, a state where the correction for increased sensitivity is currently performed, a state where the correction for decreased sensitivity is currently performed, or a state where the correction is not currently performed. The processing for updating the number of steps of correction in each case is described in the stated order.

First, processing for updating the number of steps of correction in the case where the correction for increased sensitivity is currently performed is described.

Figure 6:
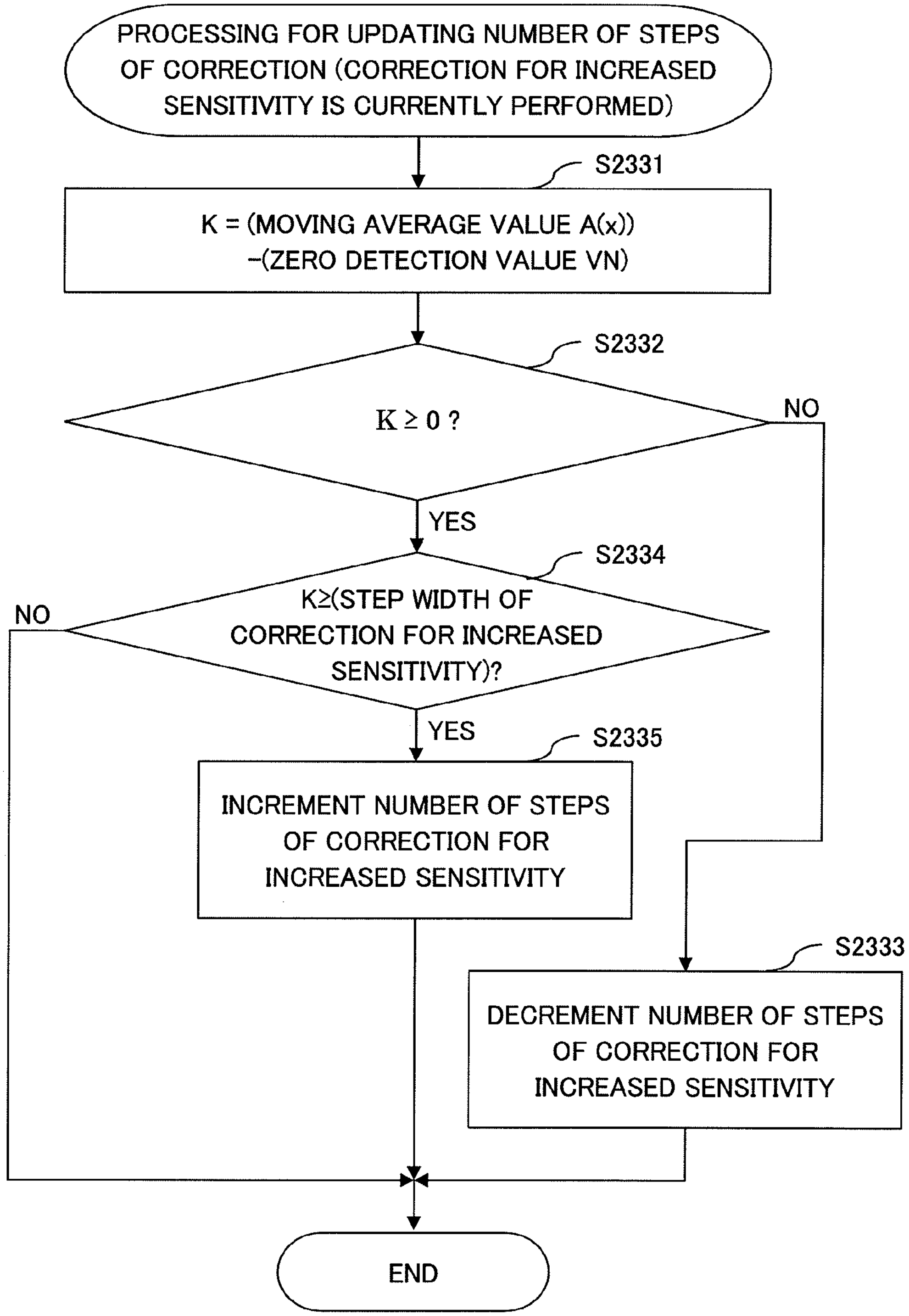
FIG. 6 is a flowchart illustrating processing for updating the number of steps of correction in the case where a correction for increased sensitivity is currently performed, which is illustrated in FIG. 5.
Figure 7:
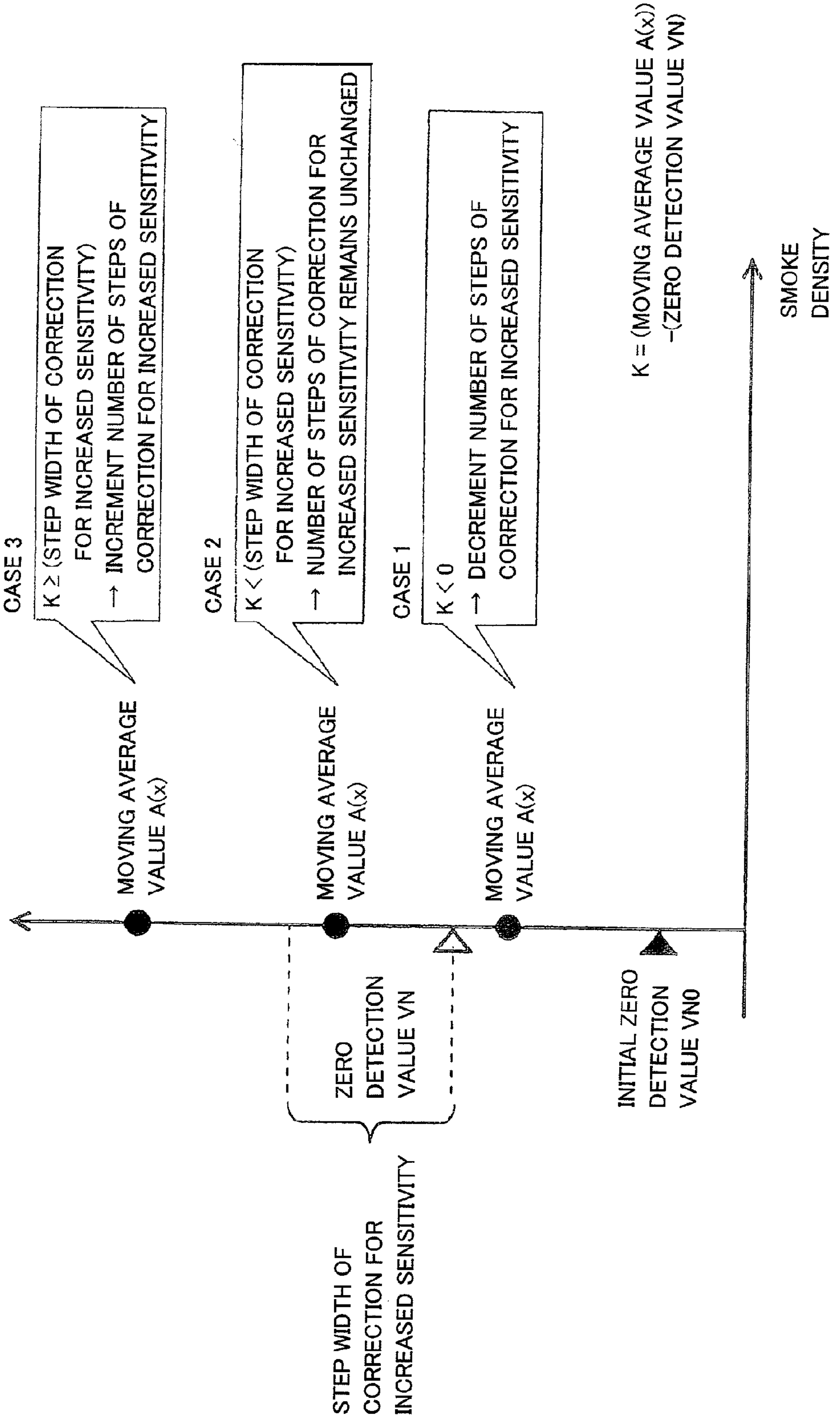
FIG. 7 is a graph showing the processing for updating the number of steps of correction, which is illustrated in FIG. 6.

FIG. 6 is a flowchart illustrating processing for updating the number of steps of correction in the case where the correction for increased sensitivity is currently performed, which is described as Step S233 illustrated in FIG. 5, and FIG. 7 is a graph showing the processing for updating the number of steps of correction.

In FIG. 6, a difference between the moving average value A(x) calculated in Step S21 illustrated in FIG. 4 and the zero detection value VN is first calculated as K (S2331). Then, it is determined whether or not a value of K is equal to or larger than 0 (S2332).

When the value of K is less than 0, specifically, when the moving average value A(x) is smaller than the zero detection value VN (see Case 1 illustrated in FIG. 7), the number of steps of correction for increased sensitivity, which is stored in the storage section 6, is decremented (for example, by one) (S2333). In this case, the moving average value A(x) is less than the current zero detection value VN. Therefore, it can be said that the change in the detection AD value with respect to the smoke density, which is described above referring to FIG. 3, has a tendency toward a decreased sensitivity direction. Thus, by decrementing the number of steps of correction for increased sensitivity, the correction amount in an increased sensitivity direction is reduced.

When the value of K is equal to or larger than 0, it is then determined whether or not the value of K is equal to or larger than the step width of correction for increased sensitivity, which is stored in advance in the storage section 6 (S2334).

When the value of K is equal to or larger than 0, and in addition, the value of K is less than the step width of correction for increased sensitivity (see Case 2 illustrated in FIG. 7), the processing is terminated without changing the number of steps of correction for increased sensitivity. In this case, the difference between the moving average value A(x) and the current zero detection value VN is less than the step width of correction for increased sensitivity. Therefore, it can be said that the tendency of the change in the detection AD value with respect to the smoke density, which is described referring to FIG. 3, scarcely changes. The current number of steps of correction for increased sensitivity is used without being changed.

When the value of K is equal to or larger than 0, and in addition, the value of the K is equal to or larger than the step width of correction for increased sensitivity (see Case 3 illustrated in FIG. 7), the number of steps of correction for increased sensitivity, which is stored in the storage section 6, is incremented (for example, by one) (S2335). In this case, the difference between the moving average value A(x) and the zero detection value VN is equal to or larger than the step width of correction for increased sensitivity. Thus, it can be said that the change in the detection AD value with respect to the smoke density, which is described referring to FIG. 3, has a tendency toward the increased sensitivity direction. Accordingly, the correction amount is increased by incrementing the number of steps of correction for increased sensitivity.

As described above, the number of steps of correction for increased sensitivity is calculated according to the calculated value of the moving average value A(x).

Next, processing for updating the number of steps of correction in the case where the correction for decreased sensitivity is currently performed is described.

Figure 8:
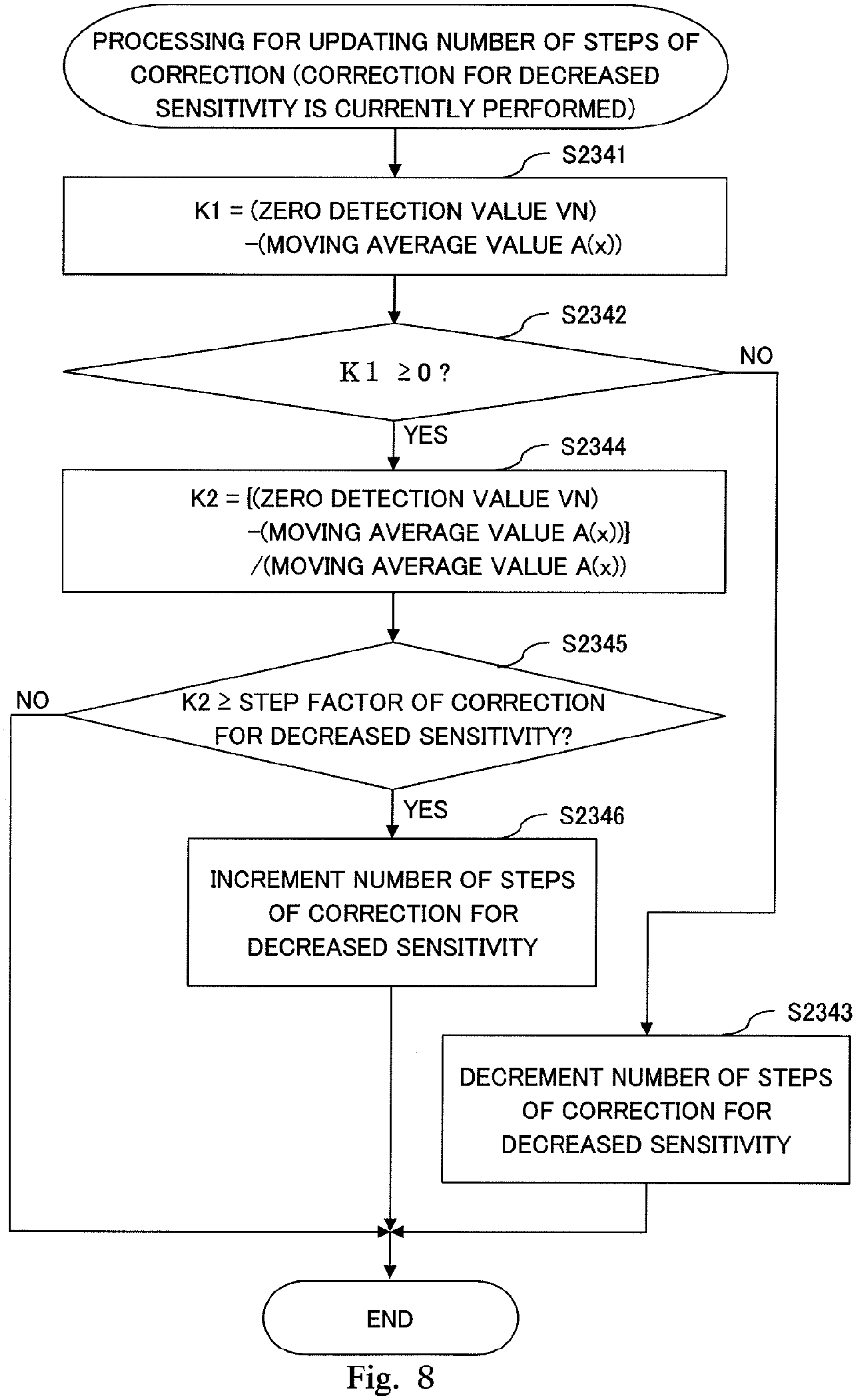
FIG. 8 is a flowchart illustrating the processing for updating the number of steps of correction in the case where a correction for decreased sensitivity is currently performed, which is illustrated in FIG. 5.
Figure 9:
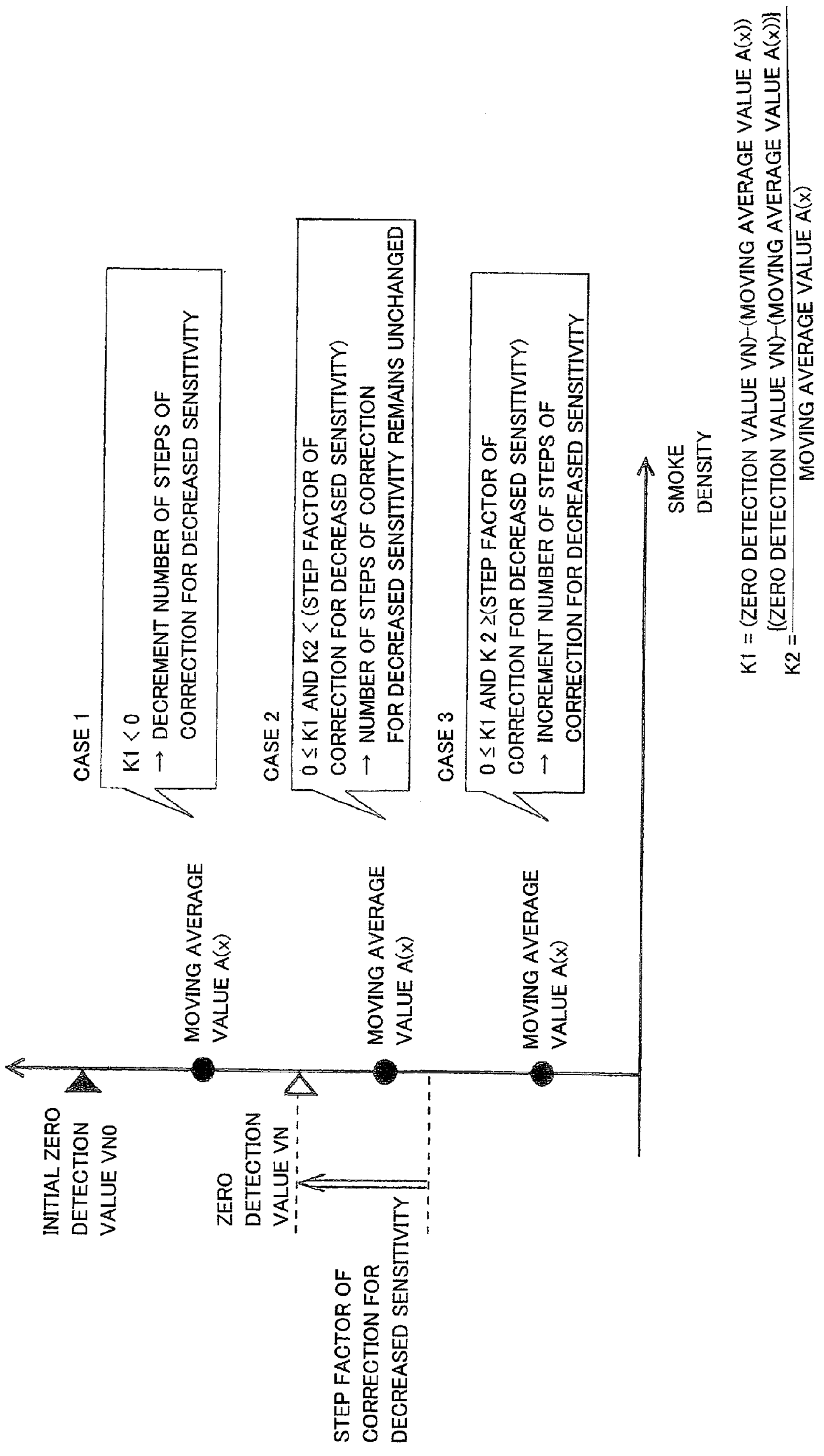
FIG. 9 is a graph showing the processing for updating the number of steps of correction illustrated in FIG. 8.

FIG. 8 is a flowchart illustrating processing for updating the number of steps of correction in the case where the correction for decreased sensitivity is currently performed, which is described as Step S234 illustrated in FIG. 5, and FIG. 9 is a graph showing the processing for updating the number of steps of correction.

In FIG. 8, a difference between the moving average value A(x) calculated in Step S21 illustrated in FIG. 4 and the zero detection value VN is first calculated as K1 (S2341). Then, it is determined whether or not a value of K1 is equal to or larger than 0 (S2342).

When the value of K1 is less than 0, specifically, when the moving average value A(x) is larger than the zero detection value VN (see Case 1 illustrated in FIG. 9), the number of steps of correction for decreased sensitivity, which is stored in the storage section 6, is decremented (for example, by one) (S2343). In this case, the moving average value A(x) is larger than the zero detection value VN. Therefore, it can be said that the change in the detection AD value with respect to the smoke density, which is described above referring to FIG. 3, has a tendency toward an increased sensitivity direction. Thus, by decrementing the number of steps of correction for decreased sensitivity, the correction amount in an decreased sensitivity direction is reduced.

When the value of K1 is equal to or larger than 0, a value obtained by dividing the difference between the zero detection value VN and the moving average value A(x) by the moving average value A(x) is calculated as K2 (S2344). Then, it is determined whether or not a value of K2 is equal to or larger than the step factor of correction for decreased sensitivity, which is stored in advance in the storage section 6 (S2345).

When the value of K2 is less than the step factor of correction for decreased sensitivity (see Case 2 illustrated in FIG. 9), the processing is terminated. In this case, it can be said that the tendency of the change in the detection AD value with respect to the smoke density, which is described referring to FIG. 3, scarcely changes because the amount of change in the moving average value A(x) with respect to the current zero detection value VN is smaller than the step factor of correction for decreased sensitivity. Therefore, the number of steps of correction for decreased sensitivity is used without being changed.

On the other hand, when the value of K2 is equal to or larger than the step factor of correction for decreased sensitivity (see Case 3 illustrated in FIG. 9), the number of steps of correction for decreased sensitivity, which is stored in the storage section 6, is incremented (for example, by one) (S2346). In this case, it can be said that the change in the detection AD value with respect to the smoke density, which is described referring to FIG. 3, has a tendency toward the decreased sensitivity direction because the amount of change in the moving average value A(x) with respect to the current zero detection value VN is equal to or larger than the step factor of correction for decreased sensitivity. Accordingly, the correction amount in the decreased sensitivity direction is increased by incrementing the number of steps of correction for decreased sensitivity.

As described above, the number of steps of correction for decreased sensitivity is calculated according to the calculated value of the moving average value A(x).

Next, processing for updating the number of steps of correction in the case where the correction is not currently performed is described.

Figure 10:
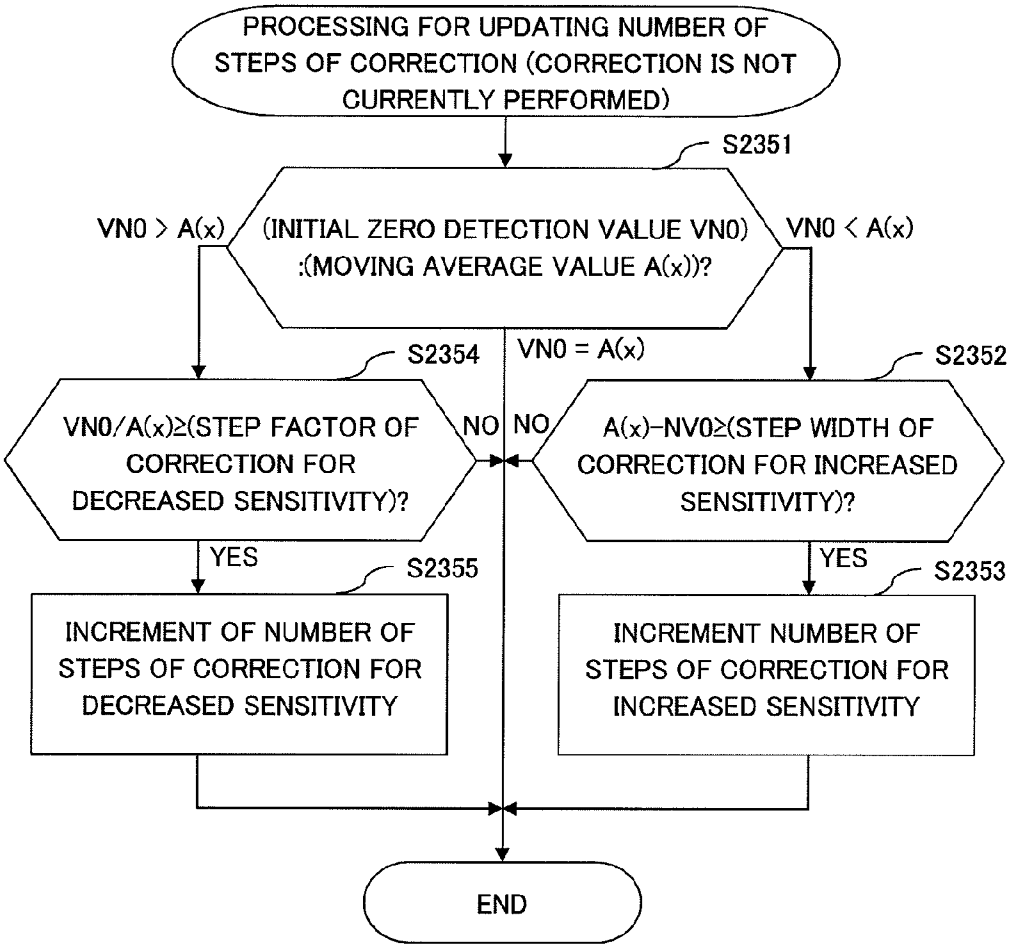
FIG. 10 is a flowchart illustrating the processing for updating the number of steps of correction in the case where the correction is not currently performed, which is illustrated in FIG. 5.
Figure 11:
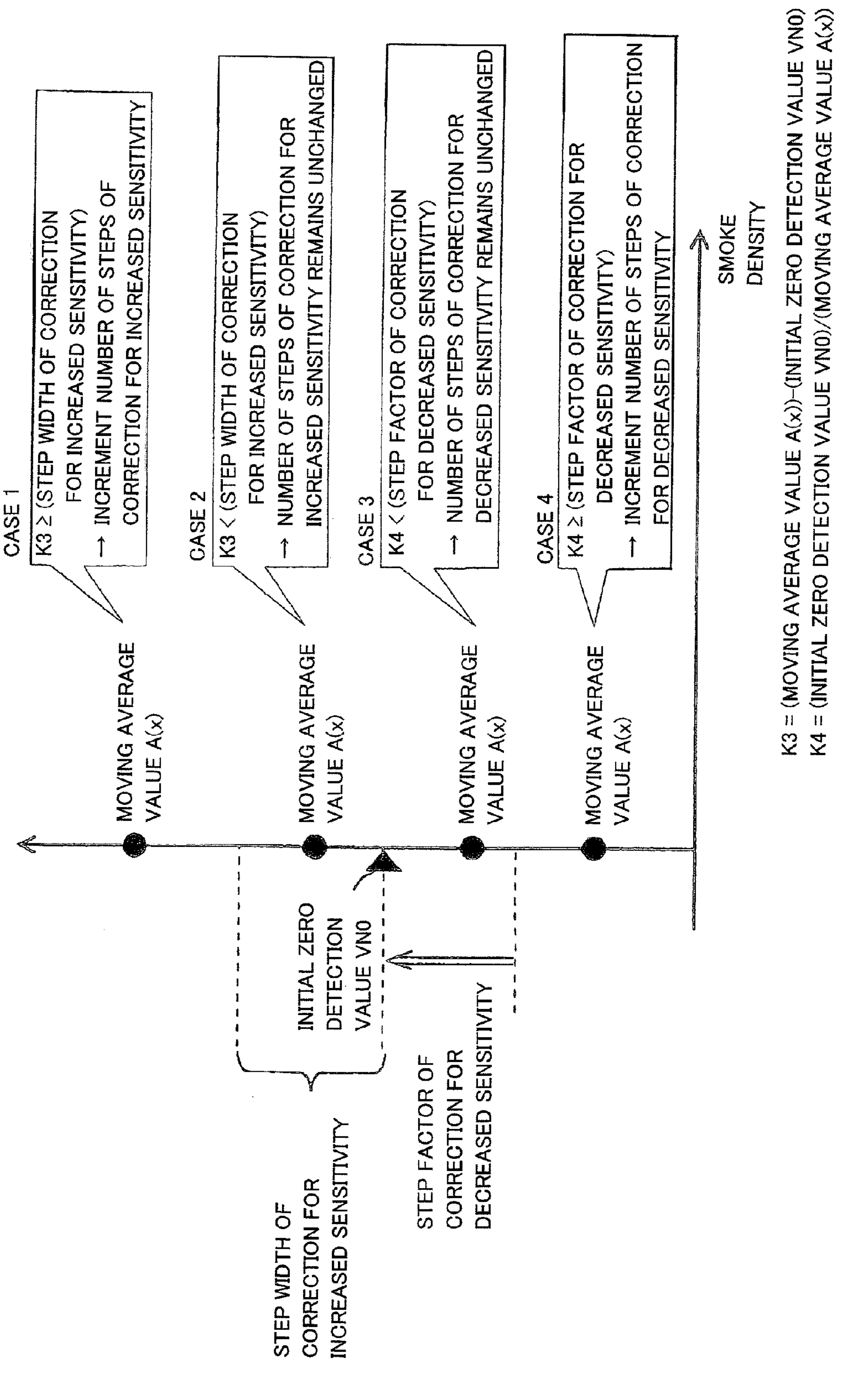
FIG. 11 is a graph showing the processing for updating the number of steps of correction illustrated in FIG. 10.

FIG. 10 is a flowchart illustrating processing for updating the number of steps of correction in the case where the correction is not currently performed, which is described as Step S235 illustrated in FIG. 5, and FIG. 11 is a graph showing the processing for updating the number of steps of correction.

In FIG. 10, first, the moving average value A(x) calculated in Step S21 illustrated in FIG. 4 and the initial zero detection value VN0 are compared with each other (S2351).

When the initial zero detection value VN0 is less than the moving average value A(x), it is then determined whether the difference between the moving average value A(x) and the initial zero detection value VN0 is equal to or larger than the step width of correction for increased sensitivity, which is stored in advance in the storage section 6 (S2352). When the difference is equal to or larger than the step width of correction for increased sensitivity (Yes; see Case 1 illustrated in FIG. 11), the number of steps of correction for increased sensitivity is incremented (for example, by one) (S2353). When the difference is less than the step width of correction for increased sensitivity (No; see Case 2 illustrated in FIG.

11), the processing is terminated without changing the number of steps of correction for increased sensitivity.

On the other hand, when the initial zero detection value VN0 is larger than the moving average value A(x), it is then determined whether or not a value obtained by dividing the initial zero detection value VN0 by the moving average value A(x) is equal to or larger than the step factor of correction for decreased sensitivity, which is stored in advance in the storage section 6 (S2354). When the value is equal to or larger than the step factor of correction for decreased sensitivity (Yes; see Case 4 illustrated in FIG. 11), the number of steps of correction for decreased sensitivity is incremented (for example, by one) (S2355). When the value is less than the step factor of correction for decreased sensitivity (No; see Case 3 illustrated in FIG. 11), the processing is terminated without changing the number of steps of correction for decreased sensitivity.

When the initial zero detection value VN0 and the moving average value A(x) are equal to each other, the processing is terminated without changing either the number of steps of correction for increased sensitivity or the number of steps of correction for decreased sensitivity.

As described above, the number of steps of correction for increased sensitivity or the number of steps of correction for decreased sensitivity is calculated based on the relation between the moving average value A(x) and the initial zero detection value VN0 so that the correction is performed in the increased sensitivity direction or the decreased sensitivity direction.

Next, in FIG. 5, after the processing for updating the number of steps of the correction (S233, S234, and S235) described above is terminated, the processing for updating the zero detection value VN (S236) is performed. The processing for updating the zero detection value VN is processing for updating the zero detection value VN described referring to FIGS. 6, 8, and 10 according to the current number of steps of correction for increased sensitivity or the current number of steps of correction for decreased sensitivity. Hereinafter, the processing for updating the zero detection value VN is described referring to FIG. 12.

Figure 12:
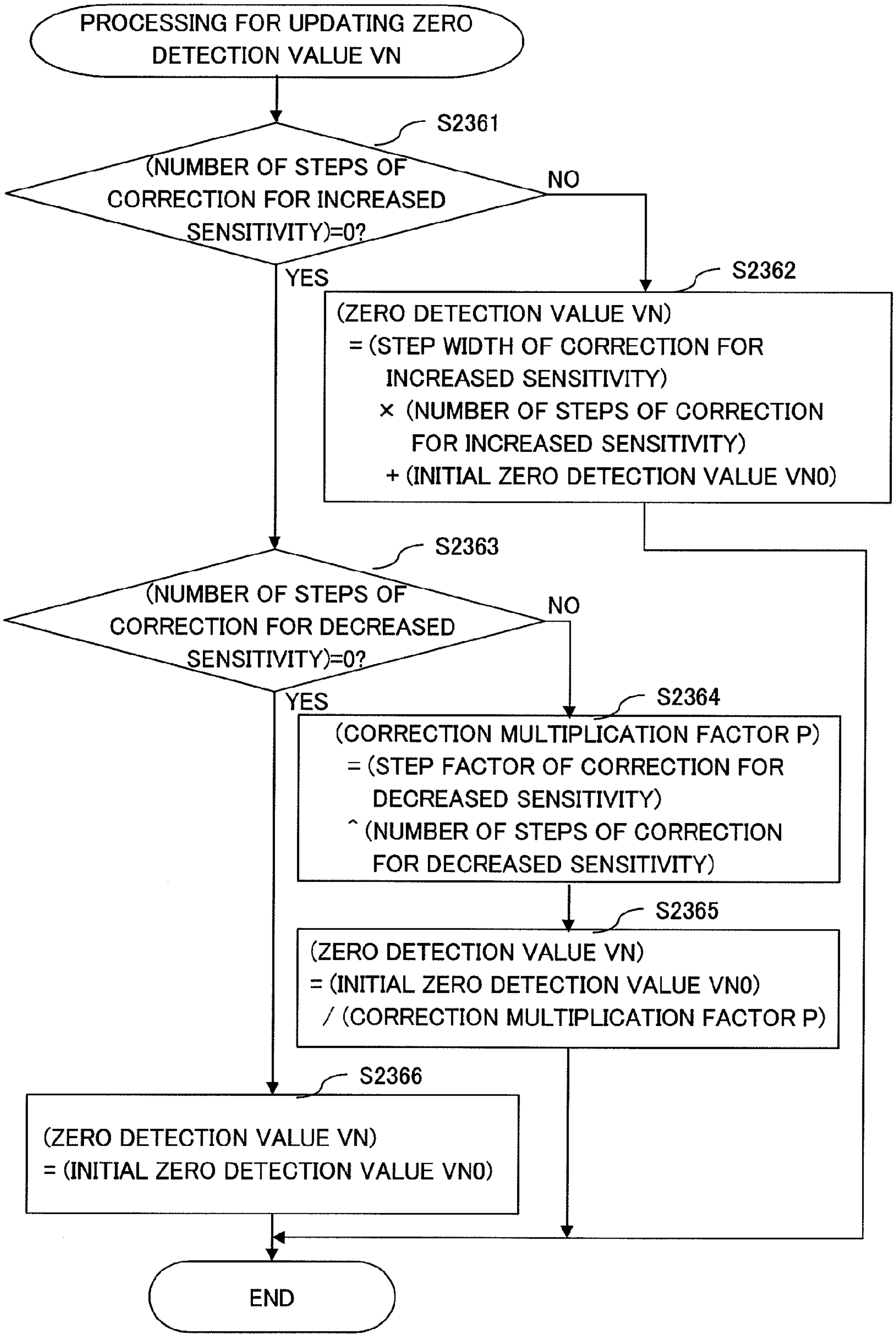
FIG. 12 is a flowchart illustrating processing for updating a zero-detection value VN, which is illustrated in FIG. 5.

FIG. 12 is a flowchart illustrating the processing for updating the zero detection value VN.

(S2361)

First, it is determined whether or not the number of steps of correction for increased sensitivity, which is stored in the storage section 6, is 0.

(S2362)

When the number of steps of correction for increased sensitivity is not 0, specifically, when the correction for increased sensitivity is currently performed, a value obtained by adding the initial zero detection value VN0 to the value obtained by multiplying the step width of correction for increased sensitivity, which is stored in the storage section 6, by the number of steps of correction for increased sensitivity, is set as the zero detection value VN.

(S2363)

When the number of steps of correction for increased sensitivity is 0, it is then determined whether or not the number of steps of correction for decreased sensitivity is 0.

(S2364 and S2365)

When the number of steps of correction for decreased sensitivity is not 0, specifically, when the correction for decreased sensitivity is currently performed, the step factor of correction for decreased sensitivity is raised to the power of the number of steps of correction for decreased sensitivity to obtain a correction multiplication factor P (S2364). The correction multiplication factor P corresponds to a predetermined correction factor of the present invention.

Then, the initial zero detection value VN0 is divided by the correction multiplication factor P to calculate the zero detection value VN (S2365).

(S2366)

When the number of steps of correction for increased sensitivity and the number of steps of correction for decreased sensitivity are both 0, specifically, neither the correction for increased sensitivity nor the correction for decreased sensitivity is currently performed, the zero detection value VN is set to the initial zero detection value VN0.

The processing for updating the correction information (S23) included in the main processing for calculating the smoke density illustrated in FIG. 4 has been described above.

Next, the details of the processing for correcting the detection AD value and calculating the smoke density illustrated in Step S24 of FIG. 4 are described. The processing for correcting the detection AD value and calculating the smoke density corresponds to processing for correcting the detection AD value based on the correction information updated in Step S23 and then calculating the analog value corresponding to the smoke density based on the corrected detection AD value. Any one of the current number of steps of correction for increased sensitivity and the current number of steps of correction for decreased sensitivity, which is updated in the aforementioned processing for updating the correction information, and the zero detection value VN are currently stored in the storage section 6.

Figure 13:
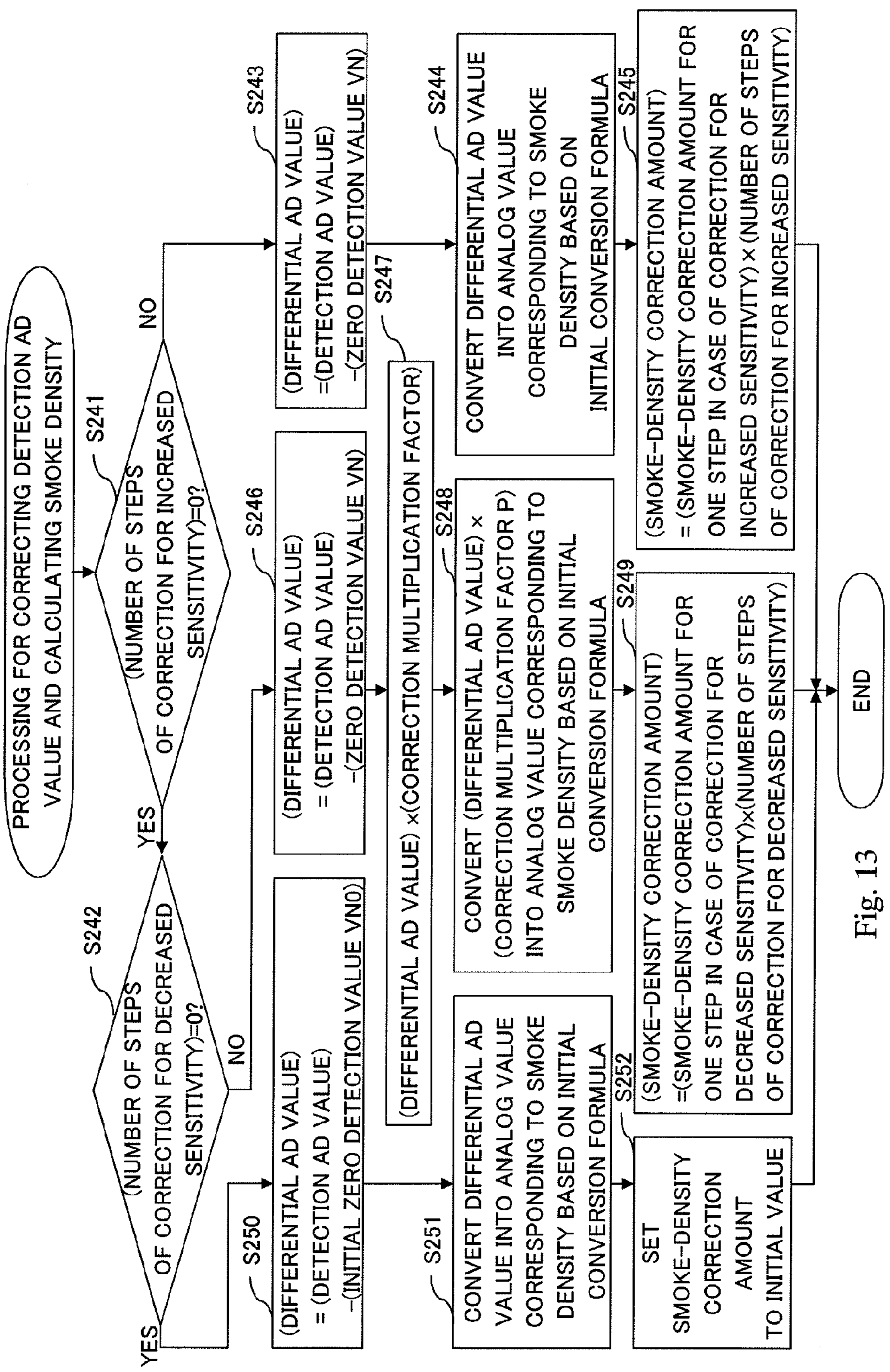
FIG. 13 is a flowchart illustrating processing for correcting the detection value, which is illustrated in FIG. 4.

FIG. 13 is a flowchart illustrating the correction of the detection AD value and the processing for calculating the smoke density.

(S241)

It is determined whether or not the number of steps of correction for increased sensitivity, which is stored in the storage section 6, is 0. When the number of steps of correction for increased sensitivity is not 0, the processing proceeds to Step S243. Then the number of steps of correction for increased sensitivity is 0, the processing proceeds to Step S242.

(S242)

It is determined whether or not the number of steps of correction for decreased sensitivity, which is stored in the storage section 6, is 0. When the number of steps of correction for decreased sensitivity is not 0, the processing proceeds to Step S246. Then the number of steps of correction for decreased sensitivity is 0, the processing proceeds to Step S250.

(S243, S244, and S245)

A processing series described below corresponds to processing performed when the number of steps of correction for increased sensitivity is not 0, specifically, the correction for increased sensitivity is currently performed.

First, a difference between the detection AD value and the zero detection value VN is obtained as a differential AD value (S243). Then, based on the initial conversion formula stored in advance in the storage section 6, the differential AD value is converted into the analog value corresponding to the smoke density (S244). Specifically, the detection AD value obtained when the zero detection value VN fluctuates upward due to the contamination of the labyrinth inner wall 1 is corrected by obtaining the difference between the detection AD value and the zero detection value VN. The thus corrected value is converted into the analog value corresponding to the smoke density based on the initial conversion formula.

Subsequently, the smoke-density correction amount for one step in the case of the correction for increased sensitivity and the number of steps of correction for increased sensitivity are multiplied to calculate the smoke-density correction amount (S245).

(S246, S247, S248, and S249)

A processing series described below corresponds to processing performed when the number of steps of correction for increased sensitivity is 0 and the number of steps of correction for decreased sensitivity is not 0, specifically, the correction for decreased sensitivity is currently performed.

First, the difference between the detection AD value and the zero detection value VN is obtained as the differential AD value (S246). Then, the differential AD value and the correction multiplication factor P (see Step S2364 illustrated in FIG. 12) are multiplied (S247). Subsequently, the value obtained by multiplying the differential AD value and the correction multiplication factor P is converted into the analog value corresponding to the smoke density based on the initial conversion formula stored in advance in the storage section 6 (S248). Specifically, the detection AD value obtained when the zero detection value VN fluctuates downward due to the contamination of the light-receiving element 3 or the light-emitting element 2 is corrected. Then, the corrected value is converted into the analog value corresponding to the smoke density based on the initial conversion formula.

Subsequently, the smoke-density correction amount for one step in the case of the correction for decreased sensitivity and the number of steps of correction for decreased sensitivity are multiplied to calculate the smoke-density correction amount (S249).

(S250, S251, and S252)

A processing series described below corresponds to processing performed when the number of steps of correction for increased sensitivity and the number of steps of correction for decreased sensitivity are both 0, specifically, neither the correction for increased sensitivity nor the correction for decreased sensitivity is currently performed.

First, a difference between the detection AD value and the initial zero detection value VN0 is obtained as the differential AD value (S250). Then, the differential AD value is converted into the analog value corresponding to the smoke density based on the initial conversion formula stored in advance in the storage section 6 (S251). The smoke-density correction amount is set to an initial value (for example, to 0) (S252).

In Steps S245 and S249, the number of steps of correction for increased sensitivity or the number of steps of correction for decreased sensitivity and the smoke-density correction amount for one step are multiplied to calculate the current smoke-density correction amount. Alternatively, the smoke-density correction amount corresponding to the number of steps of the correction may be stored in advance in the storage section 6 in the form of a table so that the current smoke-density correction amount can be obtained by referring to the table.

As described above, according to the photoelectric smoke sensor 100 of this embodiment, the different correction processing is performed for each of the case where the zero detection value is shifted upward due to the contamination of the labyrinth inner wall 1 and the case where the zero detection value is shifted downward due to the contamination of the light-receiving element 3 or the light-emitting element 2. Then, in the correction processing performed for the decreased sensitivity, the detection AD value is corrected in consideration of a change in the conversion characteristic (slope of the conversion formula) showing the relation between the detection AD value and the smoke-density data in the case of the occurrence of contamination. Specifically, the initial zero detection value VN0 is divided by the correction multiplication factor P ((step factor of correction for decreased sensitivity)^(number of steps of correction for decreased sensitivity)) to calculate the new zero detection value. In addition, the difference between the detection AD value and the updated zero detection value VN is multiplied by the correction multiplication factor P to correct the detection value. Therefore, the sensitivity can be corrected according to the state of the contamination. As a result, more accurate smoke-density data can be obtained.

In any of the case where the correction for increased sensitivity is currently performed, the case where the correction for decreased sensitivity is currently performed, and the case where the correction is not currently performed, the analog value corresponding to the smoke density can be calculated from the detection AD value based on the single initial conversion formula stored in advance in the storage section 6. Therefore, it is sufficient to store in advance the single initial conversion formula in the storage section 6, eliminating the need to store a plurality of conversion formulae. As a result, a storage capacity can be reduced.

For updating the number of steps of correction (the number of steps of correction for increased sensitivity or the number of steps of correction for decreased sensitivity), the number of steps is changed by one at a time. Thus, even if, for example, noise is superposed, the correction amount does not suddenly change.

Moreover, the step factor of correction for decreased sensitivity, which is used in the correction for decreased sensitivity, is set so that the smoke-density correction amount for one step has substantially the same value. Therefore, by multiplying the number of steps of correction for decreased sensitivity and the smoke-density correction amount for one step in the case of the correction for decreased sensitivity, the smoke-density correction amount can be easily calculated. Therefore, the amount of software programs and the processing time, which are required for the calculation of the smoke-density correction amount, can be reduced.

The smoke-density correction amount is indicative of a current degree of contamination of the photoelectric smoke sensor 100. Therefore, if the smoke-density correction amount is transmitted to the receiver 200 where the smoke-density correction amount is converted into predetermined display units for display, the user can be informed of a precise degree of contamination of the photoelectric smoke sensor 100.

In this embodiment, the step correction factor for correction for decreased sensitivity is set according to the numerical value of the step width of correction for increased sensitivity so that the smoke-density correction amount for one step in the case of the correction for increased sensitivity and the smoke-density correction amount for one step in the case of the correction for decreased sensitivity become substantially equal to each other. Therefore, the amount of change in the smoke-density correction amount for one step is the same both for the correction for increased sensitivity and for the correction for decreased sensitivity. Accordingly, the receiver 200 can inform the user of a precise degree of correction of the sensitivity (degree of contamination of the photoelectric smoke sensor 100). In this case, it is no longer necessary to store both the smoke-density correction amount for one step in the case of the correction for increased sensitivity and the smoke-density correction amount for one step in the case of the correction for decreased sensitivity in the correction reference information storing section 61.

Furthermore, the receiver 200 can distinguish the sensitivity correction amount used for the correction for increased sensitivity and the sensitivity correction amount used for the correction for decreased sensitivity from each other as the sensitivity correction amount to be transmitted to the receiver 200. Therefore, the receiver 200 can precisely inform the user of whether the degree of correction of the sensitivity (degree of contamination of the photoelectric smoke sensor 100) is on the increased sensitivity side or on the decreased sensitivity side.

In the description given above, the detection AD value is corrected and the corrected value is then converted into the analog value corresponding to the smoke density based on the initial conversion formula. The aforementioned processing is equivalent to the correction of the initial conversion formula in the same manner without correcting the detection AD value.

In the description given above, the detection AD value is corrected by the photoelectric smoke sensor 100. Instead, the same correction processing can also be performed by the receiver 200. In this case, the detection AD value detected by the photoelectric smoke sensor 100 is transmitted to the receiver 200. The receiver 200 corrects the detection AD value and then converts the corrected detection AD value into the analog value corresponding to the smoke density.

The present invention is also applicable to the photoelectric smoke sensor 100 which determines the occurrence of a fire by itself. In such a case, the same effects as those described above can be obtained.

What is claimed is:

1. A photoelectric smoke sensor comprising:

detection means including a light-emitting element and a light-receiving element housed within a smoke detection space, for outputting a detection value of the light-receiving element for receiving light scattered by smoke, the light being emitted from the light-emitting element;

a smoke-density computing section for converting the detection value output from the detection means into smoke-density data based on a conversion formula;

a zero detection value storing section for storing a zero detection value corresponding to the detection value of the light-receiving element when a smoke density is zero;

an initial zero detection value storing section for storing an initial zero detection value corresponding to an initial value of the zero detection value;

a moving average value calculating section for calculating a moving average value of the detection values output from the detection means;

a zero detection value updating section for dividing the initial zero detection value by a predetermined correction factor to calculate a new zero detection value when a sensitivity of the detection means is decreased as compared with that in an initial state, and in addition, when a rate of change in the moving average value with respect to the zero detection value exceeds a predetermined value; and a detection value correcting section for multiplying a difference between the detection value and the zero detection value updated by the zero detection value updating section by the predetermined correction factor to correct the detection value, wherein the smoke-density computing section converts the detection value corrected by the detection value correcting section into the smoke-density data based on the conversion formula.

2. A photoelectric smoke sensor according to claim 1, wherein the correction factor is calculated by raising a basic correction factor corresponding to a given value to the N-th power, where N is a value obtained by adding one to the new zero detection value previously calculated by the zero detection value updating section.

3. A photoelectric smoke sensor according to claim 2, wherein the basic correction factor is set so that, when a predetermined detection value is repeatedly corrected by using the correction factor calculated by incrementing the value of N by one at a time, an amount of change in the smoke-density data corresponding to the each corrected predetermined detection value becomes substantially the same.

4. A photoelectric smoke sensor according to claim 1, wherein, when the sensitivity of the detection means is increased as compared with that in the initial state and, in addition, when a difference between the zero detection value and the moving average value exceeds a predetermined value, the zero detection value updating section adds a predetermined correction value to the initial zero detection value to calculate the new zero detection value, and the detection value correcting section corrects the detection value by subtracting the zero detection value updated by the zero detection value updating section from the detection value.

5. A photoelectric smoke sensor according to claim 2, wherein, when the sensitivity of the detection means is increased as compared with that in the initial state and, in addition, when a difference between the zero detection value and the moving average value exceeds a predetermined value, the zero detection value updating section adds a predetermined correction value to the initial zero detection value to calculate the new zero detection value, and the detection value correcting section corrects the detection value by subtracting the zero detection value updated by the zero detection value updating section from the detection value.

6. A photoelectric smoke sensor according to claim 3, wherein, when the sensitivity of the detection means is increased as compared with that in the initial state and, in addition, when a difference between the zero detection value and the moving average value exceeds a predetermined value, the zero detection value updating section adds a predetermined correction value to the initial zero detection value to calculate the new zero detection value, and the detection value correcting section corrects the detection value by subtracting the zero detection value updated by the zero detection value updating section from the detection value.

* * * * *